US009578739B2

(12) United States Patent
Kurosawa

(10) Patent No.: US 9,578,739 B2
(45) Date of Patent: Feb. 21, 2017

(54) METAL FOIL PROVIDED WITH ELECTRICALLY RESISTIVE LAYER, AND BOARD FOR PRINTED CIRCUIT USING SAID METAL FOIL

(75) Inventor: Toshio Kurosawa, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 259 days.

(21) Appl. No.: 14/006,351

(22) PCT Filed: Feb. 15, 2012

(86) PCT No.: PCT/JP2012/053459
§ 371 (c)(1),
(2), (4) Date: Nov. 1, 2013

(87) PCT Pub. No.: WO2012/132593
PCT Pub. Date: Oct. 4, 2012

(65) Prior Publication Data
US 2014/0041910 A1 Feb. 13, 2014

(30) Foreign Application Priority Data
Mar. 31, 2011 (JP) ................................ 2011-077190

(51) Int. Cl.
| | |
|---|---|
| *H05K 1/03* | (2006.01) |
| *H05K 1/09* | (2006.01) |
| *H05K 3/38* | (2006.01) |
| *C23C 28/00* | (2006.01) |
| *C23C 14/16* | (2006.01) |
| *C23C 14/34* | (2006.01) |
| *H05K 3/02* | (2006.01) |

(52) U.S. Cl.
CPC ............... *H05K 1/09* (2013.01); *C23C 14/165* (2013.01); *C23C 14/3414* (2013.01); *C23C 28/321* (2013.01); *C23C 28/3215* (2013.01); *C23C 28/3455* (2013.01); *H05K 3/384* (2013.01); *H05K 3/022* (2013.01); *Y10T 428/1291* (2015.01); *Y10T 428/12611* (2015.01)

(58) Field of Classification Search
CPC ........ B32B 15/01; C23C 14/02; C23C 14/165; C23C 14/562; C23C 14/3414; C23C 26/00; C23C 28/00; C23C 28/021; C23C 28/022; C23C 28/023; C23C 28/321; C23C 28/345; C23C 28/3215; C23C 28/3455; C25D 3/58; C25D 5/10; C25D 5/48; C25D 7/0614; H01C 17/07; H01C 17/281; H05K 1/09; H05K 1/167; H05K 3/022; H05K 3/384; H05K 3/389; H05K 2201/0355; H05K 2203/0307; H05K 2203/0361; H05K 2203/0723; Y10T 428/28; Y10T 428/1291; Y10T 428/12611; Y10T 428/266; Y10T 428/31663; Y10T 428/31678; Y10S 428/901
USPC ......... 174/257; 205/215, 640; 428/337, 343, 428/447, 448, 450, 457, 528, 532, 632, 428/675, 901
See application file for complete search history.

(56) References Cited

U.S. PATENT DOCUMENTS

| | | | | |
|---|---|---|---|---|
| 3,869,779 | A * | 3/1975 | Gedwill | ............. B23K 20/2333 428/606 |
| 5,679,230 | A | 10/1997 | Fatcheric et al. | |
| 5,709,957 | A | 1/1998 | Chiang et al. | |
| 5,908,544 | A | 6/1999 | Lee et al. | |
| 6,489,034 | B1 | 12/2002 | Wang et al. | |
| 6,489,035 | B1 | 12/2002 | Wang et al. | |
| 6,622,374 | B1 | 9/2003 | Wang et al. | |
| 6,771,160 | B2 | 8/2004 | Wang et al. | |
| 6,824,880 | B1 * | 11/2004 | Admasu | ................. C23C 26/00 428/343 |
| 2008/0261069 | A1 * | 10/2008 | Arikawa et al. | ............. 428/632 |
| 2011/0236714 | A1 * | 9/2011 | Ohsaka et al. | ............... 428/615 |
| 2012/0094114 | A1 * | 4/2012 | Kurosawa | ............... B32B 15/01 428/337 |
| 2012/0111613 | A1 * | 5/2012 | Oguro et al. | ................. 174/254 |
| 2014/0015635 | A1 * | 1/2014 | Kurosawa | ............. C23C 14/022 338/308 |

FOREIGN PATENT DOCUMENTS

| | | | | | |
|---|---|---|---|---|---|
| JP | WO 2009063764 | A1 * | 5/2009 | ............. | C25D 5/10 |
| JP | 2009-177180 | A | 8/2009 | | |

(Continued)

OTHER PUBLICATIONS

Investigations on Machined Metal Surfaces—Jan. 2011.*

(Continued)

*Primary Examiner* — Timothy Thompson
*Assistant Examiner* — Guillermo Egoavil
(74) *Attorney, Agent, or Firm* — Howson & Howson, LLP

(57) ABSTRACT

Metal foil provided with an electrically resistive layer, characterized in that an alloy (in particular, a NiCrAlSi alloy) resistive layer containing 1 to 6 mass % of Si is formed on the metal foil controlled to have a ten-point average roughness Rz, which was measured by an optical method, of 4.0 to 6.0 μm, and the variation in the resistance value of the electrically resistive layer is within ±10%. Provided is a copper foil that allows embedding of a resistive material in a board by further forming an electrically resistive layer on the copper foil, and further allows improving the adhesiveness and suppressing the variation in resistance value within a certain range. As needed, metal foil provided in advance with a copper-zinc alloy layer formed on the surface thereof and a stabilizing layer composed of at least one component selected from zinc oxide, chromium oxide, and nickel oxide formed on the copper-zinc alloy layer is used.

12 Claims, No Drawings

(56) References Cited

FOREIGN PATENT DOCUMENTS

| JP | WO 2010110061 A1 | * | 9/2010 | ............. B32B 15/01 |
|----|------|---|--------|-------|
| KR | 20100030654 A | * | 3/2010 | ............... C25D 5/10 |
| WO | 2009/063764 A1 | | 5/2009 | |
| WO | 2010/110061 A1 | | 9/2010 | |

OTHER PUBLICATIONS

JIS-B-0601.*
European Search Report issued on Jul. 31, 2014 for corresponding EP Application No. 12764196.7.

* cited by examiner

METAL FOIL PROVIDED WITH ELECTRICALLY RESISTIVE LAYER, AND BOARD FOR PRINTED CIRCUIT USING SAID METAL FOIL

BACKGROUND

The present invention relates to a metal foil provided with an electrically resistive layer having excellent adhesiveness, high peel strength, and a low variation in resistance value, and relates to a printed circuit board comprising the metal foil.

Copper foil is generally used as a wiring material of printed circuit boards. The copper foil is classified based on the production process into electrolytic copper foil and rolled copper foil. The thickness of copper foil can be arbitrarily controlled from very thin copper foil of 5 μm to thick copper foil of about 140 μm.

The copper foil is bonded to a substrate of a resin such as an epoxy resin or a polyimide resin and is used in a printed circuit board. The copper foil is required to guarantee sufficient strength of adhesiveness to a resin serving as the substrate. Accordingly, in many cases of using electrolytic copper foil, the rough surface, a so-called mat surface, generally formed during production of the foil is further roughened and is then used. Rolled copper foil is also used similarly after surface-roughening treatment in many cases.

Recently, it is proposed to further form a thin-film layer of an electrically resistive material on copper foil serving as a wiring material (see Patent Documents 1 and 2). An electronic circuit board must comprise an electrically resistive element, and the use of copper foil provided with a resistive layer allows formation of the electrically resistive element merely by exposing the electrically resistive layer provided to the copper foil with an etching solution such as a cupric chloride solution.

Consequently, the limited surface area of the board can be effectively used by embedding the resistance in the board, compared with conventional methods of surface-mounting chip resistive elements on boards by soldering.

In addition, restriction on design is reduced by forming the resistive element inside a multilayer board, and the circuit length can be shortened to allow improvements in electrical characteristics. Accordingly, the use of copper foil having a resistive layer makes soldering unnecessary or highly reduces soldering and allows a reduction in weight and an improvement in reliability. Thus, a board having an electrically resistive layer embedded therein has many advantages.

The copper foil used as a base for resistive components is subjected to a surface treatment for further forming a resistive layer thereon. The copper foil differs from one for general printed board wiring, but is the same in the point of securing the adhesive strength to a resin by roughening.

A resin is further bonded on the resistive layer. Accordingly, in evaluation of the adhesive strength of a resistive material, it is necessary to investigate both the strength between the copper foil and the resistive layer and the strength between the resistive layer and the resin. For example, in peel strength evaluation, peeling occurs from the interface with a weaker strength.

In any case, a larger surface roughness provides a higher adhesive strength. The adhesive strength is thought to be affected by surface roughness and other factors such as surface chemical species (elemental species).

Continual improvement of the performance is required in printed circuit boards. Simultaneously, due to formation of finer resistance circuits and a demand for improvement in high-frequency characteristics, a reduction in surface roughness of resistive components is required. In order to achieve such requirements, it is necessary to increase the adhesive strength without relying on surface roughness.

However, it has not been exactly comprehended whether the surface roughness of copper foil affects an electrically resistive layer; what degree of surface roughness can maintain the characteristics of an electrically resistive layer; and what means can be employed for maintaining peel strength between an electrically resistive layer and a resin even when the adhesive strength decreases by reducing the surface roughness.

Accordingly, in conventional metal foil having an electrically resistive layer, a vague process of increasing the roughness of the surface of a copper foil is employed for enhancing the peel strength, and the above-mentioned problems have not been solved.

The present invention is an improvement of the invention of Patent Document 3 filed before by the present applicant. The invention described in Patent Document 3 is all effective and can be applied to the present invention.

Patent Document 1: Japanese Patent No. 3311338
Patent Document 2: Japanese Patent No. 3452557
Patent Document 3: Japanese Patent Application No. 2007-295117

SUMMARY OF INVENTION

Technical Problem

It is an object of the present invention to provide a metal foil having an electrically resistive layer that allows embedding of an electrically resistive material in a board by further forming the electrically resistive layer on copper foil, and has excellent film adhesion, high peel strength and a low variation in resistance value, and to provide a printed circuit board comprising the metal foil.

Solution to Problem

The present inventors have diligently studied for solving the above-mentioned problems and, as a result, have obtained findings that maintenance of the characteristics as an electrically resistive layer needs a reduction in variation of the resistance value of the electrically resistive layer and that control of the surface roughness of metal foil is important for reducing the variation in resistance value. The inventors have also obtained findings that a reduction in adhesive force due to control of the surface roughness can be comprehensively compensated by disposing an alloy layer containing Si to enhance the adhesive force between the electrically resistive layer and a resin and by providing a surface-treated layer between the electrically resistive layer and the metal foil to enhance the adhesive force between the electrically resistive layer and the metal foil.

Based on the findings, the present invention provides:

Metal foil provided with an electrically resistive layer, wherein the metal foil surface controlled to have a ten-point average roughness Rz of 4.0 to 6.0 μm measured by an optical method is subjected to surface treatment as needed for enhancing heat resistance, adhesiveness to a copper foil, and chemical resistance, an alloy resistive layer containing 1 to 6 mass % of Si is formed thereon as an electrically resistive layer, and the variation in the resistance value of the electrically resistive layer is within ±10%. The metal alloy resistive layer containing 1 to 6 mass % of Si is a NiCrAlSi alloy resistive layer.

A surface-treated layer is formed between the metal foil and the electrically resistive layer. That is, a copper-zinc alloy layer is formed on the metal foil to improve the heat resistance, and a stabilizing layer composed of at least one component selected from zinc oxide, chromium oxide, and nickel oxide is formed on the copper-zinc alloy layer to give chemical resistance and antirust effects. Consequently, the surface-treated layer can contribute to enhancement of adhesive force between the metal foil and the electrically resistive layer.

In metal foil provided with an electrically resistive layer, in particular, in a case of using copper or a copper alloy as film for a circuit board, it has been believed that a sufficient adhesive strength to the metal foil can be obtained by roughening the metal foil, forming a stabilizing layer composed of at least one component selected from zinc oxide, chromium oxide, and nickel oxide on the roughened surface, and further forming an electrically resistive layer on the stabilizing layer.

Note that in the following descriptions, the metal foil will be described typically with "copper foil" and that the term "metal foil" is used as needed.

Regarding the above, the use of copper foil having a reduced roughness level as a base may provide insufficient adhesive force and heat resistance. In order to solve this disadvantage, it is effective to form a copper-zinc alloy layer having a zinc content per unit area of 1000 to 9000 $\mu g/dm^2$ before the formation of the stabilizing layer. Consequently, the adhesive force between the copper foil and the copper-zinc alloy layer and between the copper-zinc alloy layer and the stabilizing layer and the adhesive force to the electrically resistive layer can be increased.

In a copper-zinc alloy layer having a zinc content per unit area of less than 1000 $\mu g/dm^2$, the increase in adhesive strength is low, whereas a copper-zinc alloy layer having a zinc content per unit area of higher than 9000 $\mu g/dm^2$ has low chemical resistance (corrosion by etching solution). Accordingly, the zinc content range mentioned above is desirable.

The copper-zinc alloy layer is formed by electroplating, and the copper-zinc alloy may have any zinc content. That is, a layer formed by diffusion of zinc to copper foil after electroplating is included in the copper-zinc alloy layer as long as the zinc content per unit area is 1000 to 9000 $\mu g/dm^2$. Consequently, the thickness of the copper-zinc alloy layer ranges from about 10 to 120 nm.

A stabilizing layer composed of at least one component selected from zinc oxide, chromium oxide, and nickel oxide and having a thickness within a range of 0.5 to 10 nm is preferably formed on the thus formed copper-zinc alloy layer for mainly preventing rust.

As described above, the stabilizing layer has limitations in its effect, but has an effect of enhancing the adhesiveness to copper foil.

Zinc oxide, chromium oxide, and nickel oxide are all effective as a stabilizing layer and can also be used in combination. The stabilizing layer prevents the oxidation corrosion of the copper foil, prevents the dielectric base material from being decomposed by copper, and has a function of maintaining stable peel strength.

The thickness of the stabilizing layer is usually within a range of 0.5 to 10 nm and may be 10 nm or more, such as 20 to 30 nm, as needed. A thickness of less than 0.5 nm, however, causes a decrease in performance as a stabilizing layer and also a decrease in adhesive force, whereas a thickness exceeding 10 nm may cause insufficient melting in formation of a circuit pattern by etching. Accordingly, the thickness within the range mentioned above is desirable.

A metal alloy resistive layer containing 1 to 6 mass % of Si is formed on the copper foil, even if the surface treatment exemplified above is performed. Specifically, an electrically resistive layer composed of a NiCrAlSi alloy (an alloy composed of Cr: 5 to 40 mass %, Al: 1 to 3 mass %, Si: 1 to 6 mass %, and the remainder being Ni) is formed.

The electrically resistive layer can be formed by: physical surface treatment such as sputtering, vacuum vapor deposition, or ion beam plating; chemical surface treatment such as thermal decomposition or gas-phase reaction; or wet surface treatment such as electroplating or electroless plating.

In general, the electroplating has an advantage of producing a film at low cost. Sputtering can provide a film having a uniform thickness and isotropy and therefore has an advantage of giving a resistive element with a high quality.

The electrically resistive layer is formed according to the purpose of the film, and it is desirable to appropriately select the method of adhesion or plating of the film depending on the properties of the electrically resistive layer.

The important thing here is that the characteristics as an electrically resistive layer are maintained, that is, the variation of the resistance value of the electrically resistive layer is suppressed.

The electrically resistive layer is formed as a very thin film having a thickness of about 10 $\mu m$ (5 to 50 $\mu m$), and the electric resistance value (sheet resistance) per unit area varies depending on the rough surface or the surface asperity formed by roughening treatment. In general, in the case of roughening the surface of copper foil for increasing the adhesive force (peel strength) between the copper foil and the electrically resistive layer, the asperity of the surface grown by the roughening treatment is transcribed to the electrically resistive layer as the irregularity so that the electrically resistive layer has an equivalently roughened surface.

The variation in the resistance value of such an electrically resistive layer having a roughened surface increases with an increase in the surface roughness of copper foil and with an increase in the fineness of a circuit, and the function as a resistive element formed as a circuit is highly deteriorated. The finding of the phenomenon that the roughened surface of the copper foil affects the function of the electrically resistive layer formed on the roughened surface is a strong motive for suppressing the variation of the resistance value (sheet resistance) per unit area of the electrically resistive layer within ±10% in the present invention.

The present invention suppresses the variation of the sheet resistance within ±10% and thereby enhances the function of the resistive layer.

In order to suppress the variation of the sheet resistance of the electrically resistive layer within ±10%, it is necessary to control the ten-point average roughness Rz of the surface of copper foil measured by an optical method such as vertical scanning interferometry to be 4.0 to 6.0 $\mu m$. Electrolytic copper foil has a glossy surface (shining surface: S surface) and a rough surface (mat surface: M surface), and the rough surface can be used.

This rough surface, however, does not evenly satisfy the above-mentioned requirements. Therefore, it is necessary to produce an electrolytic copper foil that can achieve a ten-point average roughness Rz of 4.0 to 6.0 $\mu m$. This can be achieved by controlling the electrolysis conditions of a conventional process of producing electrolytic copper foil.

In any case, a clear standardization that the surface of copper foil has a ten-point average roughness Rz of 4.0 to 6.0 μm measured by an optical method is necessary.

Conventionally, the rough surface of copper foil is further roughened for increasing the adhesive force (peel strength) of a film. In such a case, the roughened surface is further rough, and an Rz of 4.0 to 6.0 μm is hardly achieved.

Even in a case of roughening the glossy surface of electrolytic copper foil or rolled copper foil (both surfaces are glossy) by providing knobby grains onto the surface, less roughness is preferred for reducing the variation in electric resistance value, and the roughening treatment should be performed such that the ten-point average roughness Rz measured by an optical method is within a range of 4.0 to 6.0 μm. Excessive roughening causes a variation exceeding ±10% in the sheet resistance of the electrically resistive layer and deteriorates the function. Therefore, the roughening treatment should be carefully performed.

In any case, it is necessary to strictly control the surface of copper foil so as to retain the above-mentioned surface roughness.

However, a reduction in adhesive force between the copper foil and the electrically resistive layer and a reduction in adhesive force between the electrically resistive layer and the resin due to a reduction in the roughness of the copper foil surface cannot be avoided. As a countermeasure against such disadvantages, it is necessary to increase each adhesive force. An increase in adhesive force between the electrically resistive layer and the resin can give a certain effect. The adhesive force between the electrically resistive layer and the resin can be increased by using a metal alloy resistive layer containing 1 to 6 mass % of Si. The Si contained in the metal alloy resistive layer increases the adhesiveness to the resin. A Si content of less than 1% does not show much effect, whereas a Si content exceeding 6% shows the effect but it is not preferable since it disadvantageously affects the function of the resistive layer.

A typical example of the metal alloy resistive layer containing 1 to 6 mass % of Si is a NiCrAlSi alloy (an alloy composed of Cr: 5 to 40 mass %, Al: 1 to 3 mass %, Si: 1 to 6 mass %, and the remainder being Ni).

After the increase in the adhesive force between the electrically resistive layer and the resin, the adhesive force between the copper foil and the electrically resistive layer is increased to further enhance the adhesive force as copper foil having an electrically resistive layer. A copper-zinc alloy layer is formed on the surface (roughened as needed) of the copper foil, and a stabilizing layer composed of at least one component selected from zinc oxide, chromium oxide, and nickel oxide is formed on the copper-zinc alloy layer. The resulting copper foil can be preferably used as a base material for forming an electrically resistive layer.

As a result, the variation in the resistance value of the electrically resistive layer can be suppressed within ±10%, a sufficient adhesive force is provided between the electrically resistive layer (NiCrAlSi alloy) and the resin substrate, and the peel strength between the electrically resistive layer and the resin substrate can be 0.60 kN/m or more.

The copper foil can have a thickness of 5 to 70 μm, in particular, 5 to 35 μm. The thickness of the copper foil can be appropriately selected depending on the use, but has restriction due to the production conditions. Accordingly, the production at the thickness within the above-mentioned range is efficient.

Furthermore, the present invention can provide a printed circuit board by bonding the metal foil to a resin substrate.

In the printed circuit board, the peel strength between the electrically resistive layer and the resin substrate is 0.6 kN/m or more.

The description above has been described with the surface of copper foil as a typical example, but the phenomena are issues originated from the surface form of metal foil used. It should be comprehended that the same phenomena occur when an electrically resistive layer composed of an alloy containing 1 to 6 mass % of Si (in particular, a NiCrAlSi alloy) is formed on metal foil other than copper foil and that the present invention can be applied to metal foil other than copper foil.

The use of copper foil comprising an electrically resistive layer does not require separately forming an electrically resistive element in designing a circuit and allows forming a resistive element merely by exposing the electrically resistive layer formed in advance on the copper foil with an etching solution such as a cupric chloride solution. Accordingly, soldering is unnecessary or is highly reduced to give an effect of significantly simplifying mounting steps. In addition, the present invention particularly has a considerable effect of suppressing the variation in the resistance value of the electrically resistive layer within a certain range.

In addition, the number of components mounted and the number of solder points are decreased by using the copper foil comprising an electrically resistive layer to embed a resistive element in the board. As a result, the space on the outermost surface of the board for mounting elements other than the resistive element is increased to give an advantage of allowing a reduction in weight and size. This can increase the degree of freedom in design of the circuit. In addition, embedding of parts allowing shortening of the wiring length between elements and a reduction in number of junction points of different types of metals such as a resistive element electrode and solder in signal wiring give an effect of improving the signal characteristics in a high frequency region.

Furthermore, by forming an electrically resistive layer on the copper foil having an excellent effect of maintaining the excellent heat resistance and acid resistance, a circuit board according to the present invention can have equally-excellent heat resistance and acid resistance, and can satisfy both of the adhesive strength to a base material and a reduction in the variation of the resistance value, which are issues in copper foils comprising such an electrically resistive layer.

DESCRIPTION

The electrolytic copper foil can be produced with a conventional electrolytic apparatus. The apparatus includes a cathode drum disposed in an electrolytic bath containing an electrolytic solution. The cathode drum is rotatable in a state of being partially (appropriately a half) immersed in the electrolytic solution.

An insoluble anode is disposed so as to surround the lower half part of the circumference of the cathode drum and have a certain gap between the cathode drum and the anode. The electrolytic solution flows in the gap.

Usually, the electrolytic solution is supplied from the bottom part and passes through the gap between the cathode drum and the anode and then overflows from the upper edge of the anode. The electrolytic solution is further circulated.

A rectifier maintains a predetermined voltage between the cathode drum and the anode.

The copper electrodeposited from the electrolytic solution increases in thickness with the rotation of the cathode drum.

The raw foil (electrolytic copper foil) that has obtained a certain thickness is peeled and is continuously wound.

The thickness of the thus-produced raw foil is controlled by the distance between the cathode drum and the anode, the flow rate of the supplied electrolytic solution, or the quantity of electricity for the electrolysis. In addition, the conditions of the rough surface of the electrolytic copper foil can be controlled by the electrolytic solution composition and the electrolytic conditions.

The copper foil produced by such a copper foil-producing apparatus has a mirror surface (glossy surface) as the surface being in contact with the cathode drum and a rough surface (mat surface) having asperity as the surface on the opposite side. The electrolytic copper foil can have an arbitrary thickness, usually, a thickness of 5 to 35 μm.

The thus-produced copper foil is subjected to a cleaning step for removing the oxide film on the surface and then a water washing step. In the cleaning step, an aqueous solution of 10 to 80 g/L of sulfuric acid is usually used.

A process of producing electrolytic copper foil has been described above. Regarding rolled copper foil, an ingot obtained through melting and casting is subjected to annealing, hot-rolling, and then cold-rolling to produce copper foil having an intended thickness. In the rolled copper foil, the surface that has been brought into contact with the rolling roll becomes a glossy surface. Accordingly, roughening treatment is performed as needed. The roughening treatment may be any known roughening treatment.

An example of the roughening treatment is shown below. The following roughening treatment can also be applied to the glossy surface of the electrolytic copper foil. However, excessive roughening treatment should be avoided in every case, and the roughness is required to be strictly and constantly controlled such that the ten-point average roughness Rz measured by an optical method is 4.0 to 6.0 μm. The ten-point average roughness can be measured with, for example, an optical interference surface shape measuring apparatus, specifically, a non-contact three-dimensional surface shape roughness measuring system, model NT1100 (WYKO Optical Profiler (resolution: 0.2 μm×0.2 μm or less): manufactured by Veeco Instruments, Inc.).

Cu ion concentration: 10 to 30 g/L
Sulfuric acid concentration: 20 to 100 g/L
Electrolytic solution temperature: 20° C. to 60° C.
Current density: 5 to 80 A/dm$^2$
Treatment time: 0.5 to 30 seconds The thus-produced electrolytic copper foil or rolled copper foil is subjected to a zinc-copper alloy plating process as needed to enhance the heat resistance and the adhesiveness between the copper foil and the surface layer. The bath composition and the electroplating conditions for the zinc-copper alloy plating process are as follows:

(Zinc-Copper Alloy Plating Bath Composition and Treatment Conditions)
Bath composition:
CuCN: 60 to 120 g/L
Zn(CN)$_2$: 1 to 10 g/L
NaOH: 40 to 100 g/L
Na(CN): 10 to 30 g/L
pH: 10 to 13
Bath temperature: 60° C. to 80° C.
Current density: 100 to 10000 A/dm$^2$
Treatment time: 2 to 60 seconds As a result, a copper-zinc alloy layer having a zinc content per unit area of 1000 to 9000 μg/dm$^2$ can be formed. The electroplating is suitable for zinc-copper alloy plating. The conditions are not limited to the above as long as a copper-zinc alloy layer having a zinc content per unit area of 1000 to 9000 μg/dm$^2$ can be formed.

Accordingly, a copper-zinc alloy layer may be formed by zinc-plating on copper and then heat diffusion of the plating product. In general, as long as zinc plating is formed, a copper-zinc alloy layer is formed by heat diffusion due to the heat during pressing, and such heat diffusion can be utilized. A suitable example of the zinc plating is shown below.

(Zinc-Plating Bath Composition and Plating Conditions)
Bath composition
ZnSO$_4$.7H$_2$O: 50 to 350 g/L
pH: 2.5 to 4.5
Bath temperature: 40° C. to 60° C.
Current density: 5 to 40 A/m$^2$
Treatment time: 1 to 30 seconds Subsequently, a stabilizing layer composed of at least one component selected from zinc oxide, chromium oxide, and nickel oxide and having a thickness within a range of 0.5 to 10 nm is formed as needed on the copper foil or the zinc-copper alloy layer to provide functions of preventing rust, i.e., preventing the oxidation corrosion of the copper foil, preventing the dielectric base material from being decomposed by copper, and maintaining stable peel strength.

In an embodiment, a coating layer can be formed using an electrolytic solution containing zinc ions and chromium ions. Examples of the source of zinc ions in the electrolytic solution include ZnSO$_4$, ZnCO$_3$, and ZnCrO$_4$. Examples of the source of chromium ions in the electrolytic solution include hexavalent chromium salts or compounds such as ZnCrO$_4$ and CrO$_3$.

The concentration of the zinc ions in the electrolytic solution is within a range of 0.1 to 2 g/L, preferably 0.3 to 0.6 g/L, and more preferably 0.45 to 0.55 g/L. The concentration of the chromium ions in the electrolytic solution is within a range of 0.5 to 5 g/L, preferably 0.5 to 3 g/L, and more preferably 1.0 to 3 g/L. These conditions are those for efficient plating, and the coating layer may be formed under conditions out of the conditions mentioned above, as needed.

In another embodiment, the stabilizing layer can be formed by coating with nickel oxide and nickel metal; or zinc oxide; or chromium oxide; or a combination thereof. Examples of the source of nickel ions of the electrolytic solution include Ni$_2$SO$_4$, NiCO$_3$, and a combination thereof.

The concentration of the nickel ions in the electrolytic solution is preferably 0.2 to 1.2 g/L. Furthermore, a stabilizing layer containing phosphorus as described in U.S. Pat. No. 5,908,544 can also be used. These conditions are those for efficiently forming a stabilizing layer composed of at least one component selected from zinc oxide, chromium oxide, and nickel oxide and having a thickness within a range of 0.5 to 10 nm, and the stabilizing layer may be formed under conditions out of the conditions mentioned above, as needed.

The electrolytic solution can contain other conventional additives such as Na$_2$SO$_4$ within a range of 1 to 50 g/L, preferably 10 to 20 g/L, and more preferably 12 to 18 g/L. The electrolytic solution generally has a pH of 3 to 6 and preferably 4 to 5.

The electrolytic solution preferably has a temperature of 20° C. to 100° C. and preferably 25° C. to 45° C.

In the formation of the stabilizing layer, for example, in order to apply a current density to the copper foil, an anode is arranged adjacent to each side of the copper foil. By application of a voltage to the anode, a stabilizing layer, for example, consisting of zinc oxide and chromium oxide, is deposited on the exposing surface of the copper foil.

The current density is within a range of 1 to 100 A/ft$^2$ (about 10.8 to about 1080 A/m$^2$), preferably 5 to 25 A/ft$^2$ (about 55 to about 270 A/m$^2$), and more preferably 7 to 15 A/ft$^2$ (about 85 to about 160 A/m$^2$). In a case of arranging a plurality of anodes, the current densities of the anodes can be different from each other.

The plating time is desirably 1 to 30 seconds and preferably 5 to 20 seconds.

In a preferred example, the molar ratio of the chromium ions to the zinc ions in the electrolytic solution is preferably 0.2 to 10, more preferably 1 to 5, and most preferably about 1.4. In the present invention, the stabilizing layer formed on the copper foil desirably has a thickness of 0.5 to 10 nm, preferably 2 to 5 nm.

In the embodiments described above, the stabilizing layer is composed of chromium oxide and zinc oxide, but it may be composed of chromium oxide only. In such a case, the stabilizing layer is formed under conditions different from those described above.

The bath for forming a stabilizing layer of chromium oxide is, for example, as follows:
  $CrO_3$: 1 to 10 g/L of aqueous solution
  pH: 2
  Bath temperature: 25° C.
  Current density: 10 to 30 A/ft$^2$ (108 to 320 A/m$^2$)
  Treatment time: 5 to 10 seconds After the process of forming the stabilizing layer, washing is performed. In the washing step, for example, water is sprayed to the surfaces of copper foil (having a stabilizing layer) with spray apparatuses disposed at the upper and lower sides of the copper foil to rinse the surfaces to remove the remaining electrolytic solution to give clean surfaces. The wastewater can be collected in a container disposed under the spray nozzle.

Copper foil having a stabilizing layer on the upper face is further dried. As shown in the embodiments, forced-air dryers disposed at the upper and lower sides of the copper foil eject air to dry the surfaces of the copper foil.

An electrically resistive layer composed of an alloy containing 1 to 6 mass % of Si, typically a NiCrAlSi alloy (an alloy composed of Cr: 5 to 40 mass %, Al: 1 to 3 mass %, Si: 1 to 6 mass %, and the remainder being Ni), is formed on the copper foil subjected with surface treatment described above as needed. This film is used as an electrically resistive element of a circuit board.

EXAMPLES

Examples will now be described. These Examples are intended to facilitate understanding of the present invention and do not limit the invention.

That is, modifications, embodiments, and other examples based on the technical idea of the present invention are included in the present invention.

Example 1 and Comparative Example 1

In Example 1, an electrodeposited copper foil having a thickness of 18 μm and a rough surface having a ten-point average roughness Rz of 5.2 μm measured by an optical method (with WYKO Optical Profiler, manufactured by Veeco Instruments, Inc.) was used.

In Example 1, a copper-zinc alloy layer was formed on the rough surface of the electrolytic copper foil without performing roughening treatment, whereas in Comparative Example 1, a copper-zinc alloy layer was formed on the rough surface of the electrolytic copper foil subjected to roughening treatment to have an Rz of 7.2 μm.

The copper-zinc alloy layer was formed under conditions shown below so as to have a zinc content per unit area of about 3500 μg/dm$^2$ (rounded to the nearest hundred). The coating amount was adjusted by controlling the treatment time.

(Copper-Zinc Alloy Plating Bath Composition and Plating Conditions)
  Bath composition
  CuCN: 90 g/L
  $Zn(CN)_2$: 5 g/L
  NaOH: 70 g/L
  Na(CN): 20 g/L
  Bath temperature: 70° C.
  Current density: 500 A/dm$^2$
  Treatment time: 5 to 20 seconds Subsequently, a stabilizing layer composed of zinc oxide-chromium oxide and having a thickness of about 5 nm was formed on the copper-zinc alloy layer under the following treatment conditions:
(Stabilizing Treatment Bath Composition and Treatment Conditions)
  Bath composition:
  $ZnSO_4$: 0.53 g/L in terms of zinc
  $CrO_3$: 0.6 g/L in terms of chromium
  $Na_2SO_4$: 11 g/L
  Bath pH: 5.0
  Bath temperature: 42° C.
  Current density: 85 to 160 A/m$^2$
  Plating time: 3 to 4 seconds Subsequently, in each of Example 1 and Comparative Example 1, a film having sheet resistance shown in Table 1 was formed on the stabilizing layer of the chromium-zinc oxide by sputtering an alloy consisting of 56% nickel (Ni), 38% chromium (Cr), and 2% aluminum (Al) and 4% silicon (Si) as dopants with a 14-inch sputtering apparatus under the following conditions:
  Power: 0.85 to 2.3 kW
  Linear velocity: 0.49 ft/min (0.15 m/min)

Regarding the thus-produced copper foil laminated on a resin substrate, the peel strength as received, the peel strength after soldering (heat resistance), and the peel strength after hydrochloric acid treatment (hydrochloric acid resistance) were investigated.

The peel strength after soldering is the value measured after immersion in a molten solder bath at 260° C. for 20 seconds (i.e., in a state where it was subjected to heat treatment), that is, the peel strength after soldering indicates the peeling strength after the treatment (after receiving thermal influence). The measurement was performed for evaluating heat resistance.

The peel strength after hydrochloric acid treatment is the value measured after immersion in an 18 mass % hydrochloric acid solution at room temperature for 1 hour. The measurement was performed for evaluating hydrochloric acid resistance. The same applies to the following.

The results were that the peel strength as received was 1.05 kN/m and that the peel strength after soldering (heat resistance) was 0.96 kN/m. Thus, the deterioration was low even after soldering to maintain satisfactory properties. The average sheet resistance was 24 Ω/sq (☐), and the variation thereof was 7.2%.

In contrast, in the sample of Comparative Example 1, the peel strength as received was 1.42 kN/m, and the peel strength after soldering (heat resistance) was 1.30 kN/m.

Thus, the deterioration was low even after soldering to maintain satisfactory properties, but the sheet resistance was 40 Ω/sq (□), and the variation thereof was high at 16.0%.

Comparative Examples 2 and 3

As Comparative Examples 2 and 3, films having sheet resistance shown in Table 1 were formed as electrically resistive layers on the respective copper foil treated as in Example 1 and Comparative Example 1 by sputtering a nickel 80%-chromium 20% alloy with the 14-inch sputtering apparatus under the following conditions:
Power: 3 kW
Linear velocity: 0.4 m/min In these cases, when the surface roughness was low, the variation in sheet resistance was low, at 7.5%, but the peel strength as received was an insufficient value, at 0.57 kN/m. When the surface roughness was high, the peel strength as received was sufficient, at 0.92 kN/m, but the variation in sheet resistance was an unsuitable value, at 18.0%. The results are shown in Table 1.

The results above demonstrate that a NiCrAlSi alloy shows sufficiently high strength of adhesiveness to a substrate and a resin and is effective as an electrically resistive layer in the process of producing an electrically resistive element in a circuit board.

TABLE 1

|  | Roughness Rz (μm) | Sheet resistance (Ω/□) | Variation in sheet resistance (%) | Peel strength as received (kN/m) | Solder bath peel strength (kN/m) |
|---|---|---|---|---|---|
| Example 1 | 5.2 | 24 | 7.2 | 1.05 | 0.96 |
| Comparative Example 1 | 7.2 | 40 | 16.0 | 1.42 | 1.30 |
| Comparative Example 2 | 5.2 | 23 | 7.5 | 0.57 | 0.53 |
| Comparative Example 3 | 7.2 | 38 | 18.0 | 0.92 | 0.85 |

Roughness Rz: ten-point average roughness Rz measured by an optical method
Solder bath peel strength: peel strength after immersion in molten solder bath at 260° C.

[Influence by Ten-Point Average Roughness Rz]

Examples 2 and 3 and Comparative Examples 4 and 5

Subsequently, investigation was made on the characteristics when the ten-point average roughness Rz measured by an optical method was changed based on the conditions of Example 1 which showed satisfactory characteristics. The Rz values were adjusted to 4.0 μm, 6.0 μm, 6.7 μm, and 3.5 μm in Examples 2 and 3 and Comparative Examples 4 and 5, respectively.

Other conditions were the same as those in Example 1. The results are shown in Table 2.

TABLE 2

|  | Roughness Rz (μm) | Sheet resistance (Ω/□) | Variation in sheet resistance (%) | Peel strength as received (kN/m) | Solder bath peel strength (kN/m) |
|---|---|---|---|---|---|
| Example 2 | 4.0 | 21 | 7.0 | 0.98 | 0.90 |
| Example 3 | 6.0 | 28 | 8.0 | 1.15 | 1.07 |

TABLE 2-continued

|  | Roughness Rz (μm) | Sheet resistance (Ω/□) | Variation in sheet resistance (%) | Peel strength as received (kN/m) | Solder bath peel strength (kN/m) |
|---|---|---|---|---|---|
| Comparative Example 4 | 6.7 | 36 | 10.0 | 1.30 | 1.21 |
| Comparative Example 5 | 3.5 | 17 | 5.7 | 0.80 | 0.72 |

Roughness Rz: ten-point average roughness Rz measured by an optical method
Solder bath peel strength: peel strength after immersion in molten solder bath at 260° C.

Examples 4 to 8

NiCrAlSi Alloy Resistive Layers Having Different Compositions

All of the resistive layers had a thickness of about 170 nm, and the compositions of the NiCrAlSi alloys were five types shown in Table 3. The compositions of the resistive films shown in Table 3 are indicated by mass % values of Ni/Cr/Al/Si. That is, the compositions were Ni: 65 mass %, Cr: 29 mass %, Al: 4 mass %, and Si: 2 mass % in Example 4; Ni: 54 mass %, Cr: 37 mass %, Al: 6 mass %, and Si: 3 mass % in Example 5; Ni: 89 mass %, Cr: 5 mass %, Al: 4 mass %, and Si: 2 mass % in Example 6; Ni: 54 mass %, Cr: 40 mass %, Al: 4 mass %, and Si: 2 mass % in Example 7; and Ni: 57 mass %, Cr: 40 mass %, Al: 2 mass %, and Si: 1 mass % in Example 8. The copper foil had a surface roughness Rz of 5.2 μm.

Resistive layers were formed on the stabilizing layers by sputtering the respective NiCrAlSi alloys under the same conditions as those in Example 1 with a 14-inch sputtering apparatus under the following conditions:
Power: 5 to 8 kW
Linear velocity: 1.8 to 2.8 ft/min (0.55 to 0.85 m/min)

As shown in Table 3, Examples 4 to 8, respectively, have sheet resistance of 14 to 30Ω/□, variation in the sheet resistance of 6.9 to 7.5%, peel strength as received of 1.02 to 1.06 kN/m, and solder bath peel strength of 0.96 to 0.98 kN/m. All samples showed satisfactory properties.

TABLE 3

|  | Composition of resistive film | Sheet resistance (Ω/□) | Variation in sheet resistance (%) | Peel strength as received (kN/m) | Solder bath peel strength (kN/m) |
|---|---|---|---|---|---|
| Example 4 | 65/29/4/2 | 21 | 7.3 | 1.04 | 0.98 |
| Example 5 | 54/37/6/3 | 30 | 7.5 | 1.06 | 0.97 |
| Example 6 | 89/5/4/2 | 14 | 6.9 | 1.02 | 0.96 |
| Example 7 | 54/40/4/2 | 27 | 7.4 | 1.04 | 0.97 |
| Example 8 | 57/40/2/1 | 23 | 7.4 | 1.03 | 0.96 |

Solder bath peel strength: peel strength after immersion in molten solder bath at 260° C.

[Rolled Copper Foil]

Examples 9 and 10 and Comparative Examples 6 and 7

In these Examples, rolled copper foil having a thickness of 18 μm was used. This rolled copper foil was subjected to roughening treatment under the conditions shown below. The surfaces after roughening treatment were adjusted so as to have a ten-point average roughness Rz of 4.1 μm (Example 9), 5.9 μm (Example 10), 3.5 μm (Comparative Example 6), or 6.8 μm (Comparative Example 7) when measured by an optical method.
  Cu ion concentration: 20 g/L
  Sulfuric acid concentration: 60 g/L
  Electrolytic solution temperature: 40° C.
  Current density: 30 A/dm$^2$
  Treatment time: 5 seconds
  Subsequently, a Zn-plated layer was formed on each roughened rolled copper foil at 3500 μg/dm$^2$ under the following conditions. The thickness of the plated zinc was controlled by the treatment time.
  Zinc plating bath composition:
  $ZnSO_4 \cdot 7H_2O$: 50 to 350 g/L
  pH: 3
  Bath temperature: 50° C.
  Current density: 20 A/m$^2$
  Treatment time: 2 to 3 seconds
  The copper foil having the treatment layer was heated at 300° C. to form a copper-zinc alloy layer. The thus-formed copper-zinc alloy layer had a zinc content per unit area of about 3500 μg/dm$^2$ (rounded to the nearest hundred).
  Subsequently, a stabilizing layer composed of zinc oxide-chromium oxide and having a thickness of about 50 Å was formed on the copper-zinc alloy layer under the following treatment conditions:
  Bath composition:
  $ZnSO_4$: 0.53 g/L in terms of zinc
  $CrO_3$: 0.6 g/L in terms of chromium
  $Na_2SO_4$: 11 g/L
  pH of bath: 5.0
  Bath temperature: 42° C.
  Current density: 85 to 160 A/m$^2$
  Plating time: 3 to 4 seconds
  Subsequently, a film was deposited on the stabilizing layer by sputtering an electrically resistive alloy material consisting of 56% nickel (Ni), 38% chromium (Cr), and 2% aluminum (Al) and 4% silicon (Si) as dopants with a 14-inch sputtering apparatus under the following conditions:
  Power: 0.85 to 2.3 kW
  Linear velocity: 0.49 ft/min (0.15 m/min)
  Thickness of NiCrAlSi alloy resistive layer: about 10 nm
  The sheet resistance of the resistive material, which slightly varied depending on the roughness, was about 160 Ω/sq (□).
  Regarding the coating layer for the above copper foil, the peel strength as received, the heat resistance (peel strength after soldering), and the hydrochloric acid resistance (peel strength after hydrochloric acid treatment) were investigated.
  The results are shown in Table 4. As shown in Table 4, the samples of Examples 9 and 10 and Comparative Example 7 having Rz higher than the lower limit, respectively, showed satisfactory properties such that peel strength as received was 0.97 to 1.28 kg/cm, and the peel strength after solder immersion was 0.89 to 1.19 kg/cm. In contrast, the sample of Comparative Example 6 having Rz lower than the lower limit of the roughness did not have sufficient strengths.
  The variations in the resistance value of the thus-formed NiCrAlSi alloy electrically resistive layers were 6.9 to 8.2% in Examples 9 and 10, which are satisfactory results.
  In contrast, as in electrolytic copper foil, in the sample of Comparative Example 7 having a surface roughness Rz larger than the range, the variation was high, at 10.3%.
  Examples using rolled copper foil have been described above. It will be easily understood that the similar results are also obtained in the glossy surfaces (S surfaces) of electrolytic copper foil, because the roughened surface of each copper foil is the common issue. These Examples include cases of the glossy surfaces.

TABLE 4

| | Sheet resistance (Ω/□) | Variation in sheet resistance (%) | Peel strength as received (kN/m) | Solder bath peel strength (kN/m) |
|---|---|---|---|---|
| Example 9 | 20 | 6.9 | 0.97 | 0.89 |
| Example 10 | 28 | 8.2 | 1.12 | 1.05 |
| Comparative Example 6 | 18 | 5.8 | 0.78 | 0.69 |
| Comparative Example 7 | 35 | 10.3 | 1.28 | 1.19 |

Solder bath peel strength: peel strength after immersion in molten solder bath at 260° C.

In the present invention, the use of copper foil comprising an electrically resistive layer does not require separate formation of an electrically resistive element in designing a circuit and allows formation of a resistive element merely by exposing the electrically resistive layer formed on the copper foil with an etching solution such as a cupric chloride solution. Accordingly, soldering is unnecessary or is highly reduced to give an effect of significantly simplifying mounting steps. In addition, the present invention particularly has a considerable effect of suppressing the variation in the resistance value of the electrically resistive layer within a certain range.
  The present invention has effects of considerably lessening the circuit-designing and producing processes and improving the signal characteristics in a high frequency region by comprising a resistive element in the copper foil. In addition, the present invention can suppress the decrease in adhesive force, which is a disadvantage associated with the copper foil comprising an electrically resistive layer, and therefore has an excellent effect of maintaining the satisfactory heat resistance and acid resistance of copper foil to be effective as a printed circuit board.

The invention claimed is:
1. Metal foil provided with an electrically resistive layer, characterized in that an alloy resistive layer containing 1 to 6 mass % of Si is formed on the metal foil controlled to have a ten-point average roughness Rz, which was measured by an optical method, of 4.0 to less than 6.0 μm, and the variation in the resistance value of the electrically resistive layer is within ±10%, wherein when a resin substrate is laminated to the metal foil provided with an electrically resistive layer, peel strength as received between the electrically resistive layer and the resin substrate is 0.60 kN/m or more.
2. The metal foil provided with an electrically resistive layer according to claim 1, characterized in that the alloy resistive layer containing 1 to 6 mass % of Si is a NiCrAlSi alloy resistive layer.
3. The metal foil provided with an electrically resistive layer according to claim 2, characterized in that the metal foil is provided with a copper-zinc alloy layer formed on the metal foil surface, a stabilizing layer composed of at least one component selected from zinc oxide, chromium oxide, and nickel oxide formed on the copper zinc alloy layer, and the alloy resistive layer formed on the stabilizing layer.
4. The metal foil provided with an electrically resistive layer according to claim 3, characterized in that the copper- zinc alloy layer has a zinc content per unit area of 1000 to 9000 µg/dm², and the stabilizing layer has a thickness within a range of 0.5 to 10 nm.

5. The metal foil provided with an electrically resistive layer according to claim 4, characterized in that the metal foil is a copper or copper alloy foil having a thickness of 5 to 35 µm.

6. The metal foil provided with an electrically resistive layer according to claim 5, characterized in that the electrically resistive layer is formed on a rolled copper foil or a glossy surface of an electrolytic copper foil, controlled by being subjected to roughening treatment to have a ten-point average roughness Rz, which was measured by an optical method, of 4.0 to less than 6.0 µm.

7. A printed circuit board in which the metal foil according to claim 6 is bonded to a resin substrate, characterized in that the peel strength between the electrically resistive layer and the resin substrate is 0.60 kN/m or more.

8. The metal foil provided with an electrically resistive layer according to claim 1, characterized in that the metal foil is provided with a copper-zinc alloy layer formed on the metal foil surface, a stabilizing layer composed of at least one component selected from zinc oxide, chromium oxide, and nickel oxide formed on the copper zinc alloy layer, and the alloy resistive layer formed on the stabilizing layer.

9. The metal foil provided with an electrically resistive layer according to claim 8, characterized in that the copper-zinc alloy layer has a zinc content per unit area of 1000 to 9000 µg/dm², and the stabilizing layer has a thickness within a range of 0.5 to 10 nm.

10. The metal foil provided with an electrically resistive layer according to claim 1, characterized in that the metal foil is a copper or copper alloy foil having a thickness of 5 to 35 µm.

11. The metal foil provided with an electrically resistive layer according to claim 1, characterized in that the electrically resistive layer is formed on a surface of the copper or copper-alloy foil, which is a surface of a rolled copper foil or a glossy surface of an electrolytic copper foil, controlled by being subjected to roughening treatment to have a ten-point average roughness Rz, which was measured by an optical method, of 4.0 to less than 6.0 µm.

12. A metal foil according to claim 1, further comprising a resin substrate to which the metal foil is bonded, wherein peel strength between the electrically resistive layer and the resin substrate is 0.60 kN/m or more.

\* \* \* \* \*